United States Patent
Yasuda

[11] Patent Number: 5,578,958
[45] Date of Patent: Nov. 26, 1996

[54] LOGARITHMIC AMPLIFIER

[75] Inventor: Hiroaki Yasuda, Kanagawa-ken, Japan

[73] Assignee: Fuji Photo Film Co., Ltd., Kanagawa, Japan

[21] Appl. No.: 526,094

[22] Filed: Sep. 11, 1995

[30]  Foreign Application Priority Data

Sep. 12, 1994 [JP] Japan .................................. 6-216860

[51] Int. Cl.$^6$ .......................... H03G 11/08; G06F 7/556
[52] U.S. Cl. ............................................. 327/350; 327/561
[58] Field of Search ...................................... 327/350, 351, 327/352, 362, 560, 561, 562, 563

[56] References Cited

U.S. PATENT DOCUMENTS

| | | | |
|---|---|---|---|
| 3,760,185 | 9/1973 | Green | 327/350 |
| 3,790,819 | 2/1974 | Chamran | 327/352 |
| 3,967,105 | 6/1976 | Harrington | 327/350 |
| 4,891,603 | 1/1990 | Oda | 327/350 |
| 5,327,029 | 7/1994 | Ericson et al. | 327/350 |

FOREIGN PATENT DOCUMENTS 2-277181  11/1990  Japan .................................. G06G 7/24

Primary Examiner—Toan Tran
Attorney, Agent, or Firm—Sughrue, Mion, Zinn, Macpeak & Seas

[57]  ABSTRACT

A logarithmic amplifier for preventing an abnormal output from occurring when receiving an excessive input. The logarithmic amplifier is provided with an operational amplifier for logarithmic conversion purposes and a feedback circuit for feeding back an output from the operational amplifier via a resistor connected to an output terminal of the operational amplifier. An element (for example, an element consisting of a Zener diode and a diode connected in series with each other) having an effective resistance which becomes smaller when a voltage above a predetermined value is applied to the element is connected in parallel with a resistor connected to an output terminal of an operational amplifier for logarithmic conversion purposes.

12 Claims, 3 Drawing Sheets

5,578,958

LOGARITHMIC AMPLIFIER

BACKGROUND OF THE INVENTION

1. Field of the Invention

The present invention relates to a logarithmic amplifier, and more particularly to a logarithmic amplifier designed to prevent an abnormal output even when an excessive input is received.

2. Description of the Prior Art

Current signals having a very wide range such as output signals from a photodetector which reads, for example, a high gradation image are often subjected to logarithmic amplification in order to make the current signals easy to handle by compressing the range. As disclosed in Unexamined Japanese Patent Publn. No. Hei-2(1990)-277181, a logarithmic amplifier for carrying out logarithmic amplification has been widely known which has an operational amplifier for logarithmic conversion purposes, and a feedback circuit for feeding back an output of the operational amplifier via a resistor connected to an output terminal of the operational amplifier.

However, as generally admitted, if such a conventional logarithmic amplifier has an input which is so large that it cause an output voltage of the operational amplifier to overshoot, the logarithmic amplifier temporarily cannot output a normal signal value, and this persists for a while even after the input has returned to a normal level. FIGS. 1A to 1C show the previously mentioned problem. In other words, if a current shown in FIG. 1A is input to the logarithmic amplifier, an output voltage shown in FIG. 1A will be obtained if the logarithmic amplifier properly works. However, in some cases, the output voltage often shows an abnormally low value for a period of $t_0$ after the input has returned to its normal level, as shown in FIG. 1C.

SUMMARY OF THE INVENTION

The present invention is conceived to overcome the foregoing drawbacks in the prior art, and the object of this invention is to provide a logarithmic amplifier which does not bring about an abnormal output even if an output voltage of an operational amplifier is so excessive that it causes overshooting.

According to the present invention, the above object is achieved by a logarithmic amplifier including an operational amplifier for logarithmic conversion purposes, and a feedback circuit for feeding back an output of the operational amplifier via a resistor connected to an output terminal of the operational amplifier, the improvement characterized by comprising an element having an effective resistance which becomes smaller when a voltage higher than a predetermined value is applied to the element, the element being connected in parallel with the resistor.

More specifically, as the element having effective resistance which becomes smaller, it is possible to use a Zener diode, an element consisting of a Zener diode and a diode connected in series with each other, or a transistor with its collector and emitter being respectively connected to either end of the resistor and with its base being connected to the output terminal of the operational amplifier via other resistors. Where the element is made of a Zener diode, or the element consisting of a Zener diode and a diode connected in series with each other, a Zener voltage of the Zener diode should preferably be set to less than a value obtained by subtracting a voltage drop, which is caused by elements forming the feedback circuit, from the maximum output voltage of the operational amplifier.

In another aspect of the present invention, the logarithmic amplifier should preferably include an oscillation prevention circuit having a capacitor connected in parallel to the feedback circuit, and a control circuit for controlling the oscillation prevention circuit in such a way that the amount of feedback via the oscillation prevention circuit is reduced in correspondence to an input current to the operational amplifier for logarithmic conversion purposes. Specifically, the amount of feedback is reduced as the input current becomes smaller.

In the logarithmic amplifier having the above configuration according to the present invention, the effective resistance of the element drops when the output voltage of the operational amplifier becomes abnormally high as a result of an excessive input. The drop in the effective resistance of the element causes the output voltage of the operational amplifier to decrease, thereby preventing output voltage overshoot. For this reason, the previously mentioned abnormal output does not occur when the input returns to a normal level.

DESCRIPTION OF THE PREFERRED EMBODIMENTS

The present invention will be described in detail hereunder with reference to the accompanying drawings.

Figure 2:
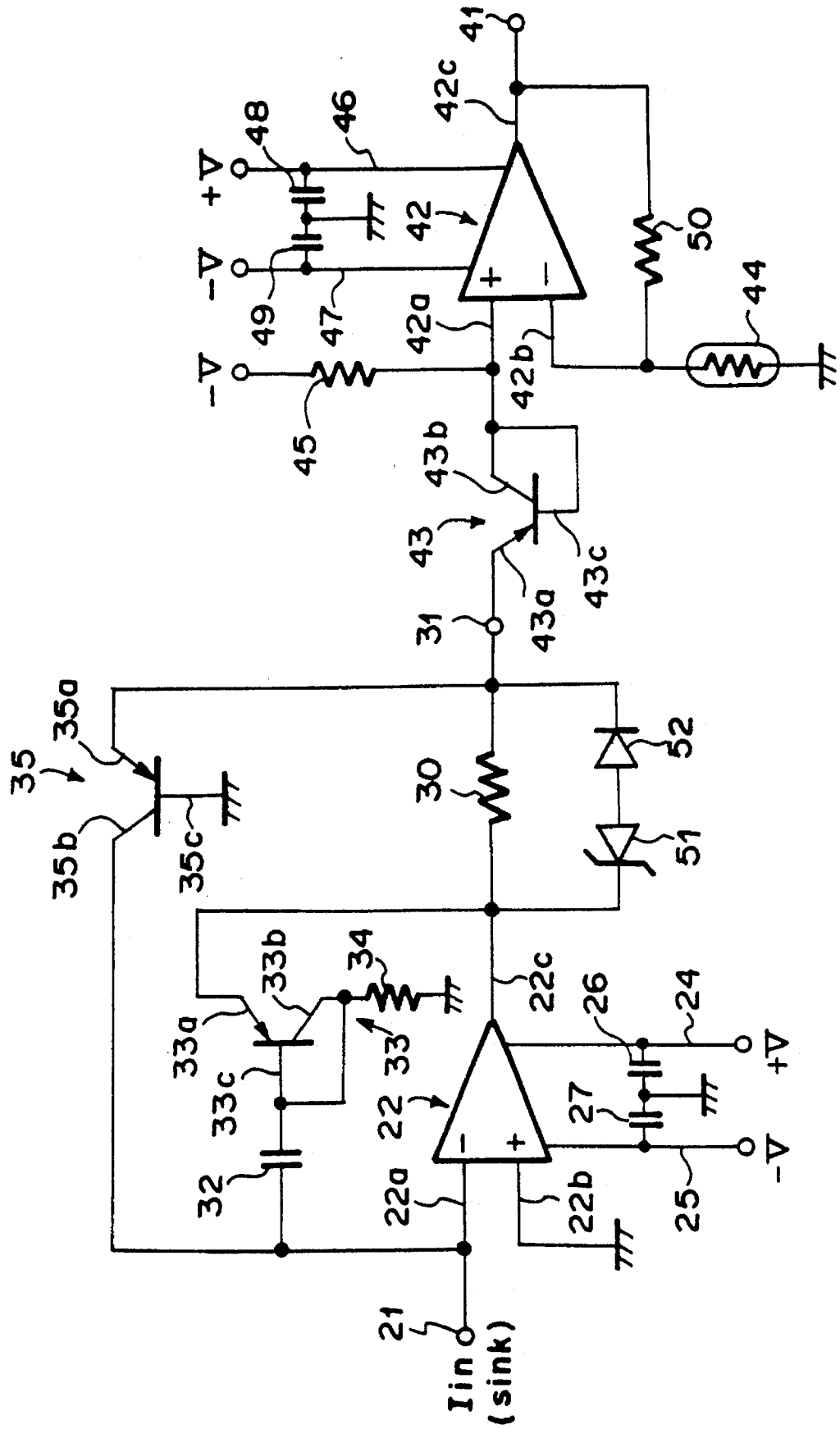
FIG. 2 is a schematic diagram showing a logarithmic amplifier according to a first embodiment of the present invention.

FIG. 2 is a logarithmic amplifier according to a first embodiment of the present invention. As shown in the drawing, an input terminal 21 of this logarithmic amplifier is connected to a negative input terminal 22a of an operational amplifier 22 for logarithmic conversion purposes. The other terminal, that is, a positive input terminal 22b of the operational amplifier 22 is grounded. Two voltage supplies, that is, a +V voltage and a −V voltage, are fed to the operational amplifier 22. Power supply lines 24 and 25 are grounded via noise prevention capacitors 26 and 27, respectively. The operational amplifier 22 is also provided with an offset regulation circuit (not shown).

An output terminal 22c of the operational amplifier 22 is connected to an output terminal 31 of a first stage via a resistor 30. An oscillation prevention capacitor 32 and a PNP transistor 33 connected in series with each other are connected between the input terminal 21 and an output terminal 22c of the operational amplifier 22. An emitter 33a and a collector 33b of this PNP transistor 33 are connected to the output terminal 22c of the operational amplifier 22 and one end of a resistor 34, respectively. The other end of the resistor 34 is grounded. A base 33c of the PNP transistor 33 is connected to a collector 33b of the transistor 33 and one end of a capacitor 32.

On the other hand, a PNP transistor 35 having an exponential characteristic is connected between the input terminal 21 and the output terminal 31 in the first stage. An emitter 35a and a collector 35b of the PNP transistor 35 are connected to the output terminal 31 and the input terminal 21, respectively, and a base 35c is grounded.

When a current signal Iin is input to the input terminal 21 of the logarithmic converter circuit having the above configuration, an output voltage (a positive voltage) corresponding to a logarithmic value of the current signal Iin appears at the output terminal 31.

A circuit in a second stage, which is constructed between the output terminal 31 of the first stage and an output terminal 41 of the logarithmic amplifier, compensates for the temperature of the logarithmic converter circuit in the first stage. The output terminal 31 of the first stage is connected to an emitter 43a of a PNP transistor 43 having the same characteristics as those of the feedback PNP transistor 35. A collector 43b of the transistor 43 is connected to a positive input terminal 42a of an operational amplifier 42 in a second stage as well as to a base 43c. This PNP transistor 43 serves as an input impedance of the operational amplifier 42 in the second stage. A transistor having the same characteristics as those of the feedback transistor 35 in the first stage is used as the transistor 43, and therefore the transistor 43 contributes to the temperature compensation of the logarithmic converter circuit in the first stage together with a temperature compensation element 44 which will be described later. The positive input terminal 42a is connected to the −V voltage power supply via a resistor 45.

As with the operational amplifier 22, this operational amplifier 42 is also connected to two power supplies, that is, a +V voltage and a −V voltage. Power supply lines 46 and 47 are grounded via capacitors 48 and 49. A resistor 50 is connected between a negative input terminal 42b and an output terminal 42c of the operational amplifier 42. The negative input terminal 42b is grounded via the temperature compensation element 44.

When a signal (having a positive voltage) which has been logarithmically converted by the first stage circuit is input to the second stage circuit having the above configuration, variations in output value resulting from temperature variations are corrected, and an appropriately amplified signal is output from the output terminal 41.

The output voltage (a positive voltage) appearing at the output terminal 22c of the operational amplifier 22 is input to the transistor 33 as well as to the operational amplifier 42 of the second stage. A resistance value between the emitter and collector of the transistor 33 decreases as a higher voltage is applied to the emitter 33a. As a result, the amount of feedback via the capacitor 32 becomes larger, and the operation of the circuit becomes stable. On the other hand, when the voltage applied to the emitter 33a of the transistor 33 drops, the resistance value between the emitter and collector of the transistor 33 rises. As a result, the amount of feedback via the capacitor 32 becomes smaller, thereby resulting in the frequency response of the circuit being improved.

An explanation will now be given of a configuration for coping with an excessive input. An element consisting of a Zener diode 51 and a diode 52 connected in series with each other is connected in parallel with the resistor 30. The Zener diode 51 does not allow the flow of a current if a voltage across the Zener diode 51 is less than a Zener voltage (a breakdown voltage), but allows the flow of a reverse current if a voltage higher than the Zener voltage is applied across the Zener diode 51. As the Zener diode 51, a Zener diode with a Zener voltage below a value obtained by subtracting a voltage drop, caused by the feedback transistor 35, from the maximum output voltage of the operational amplifier 22 is selectively used.

Figure 1A:
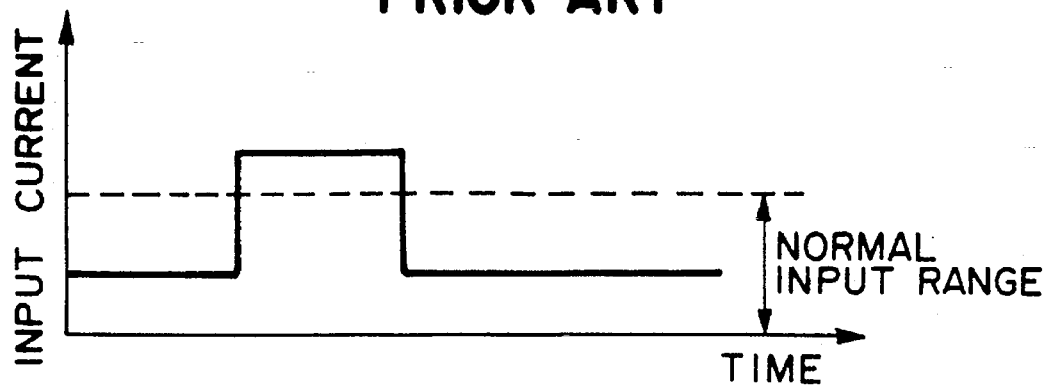
FIGS. 1A to 1C are waveforms for illustrating an abnormal output which occurs in a conventional logarithmic amplifier.
Figure 1B:
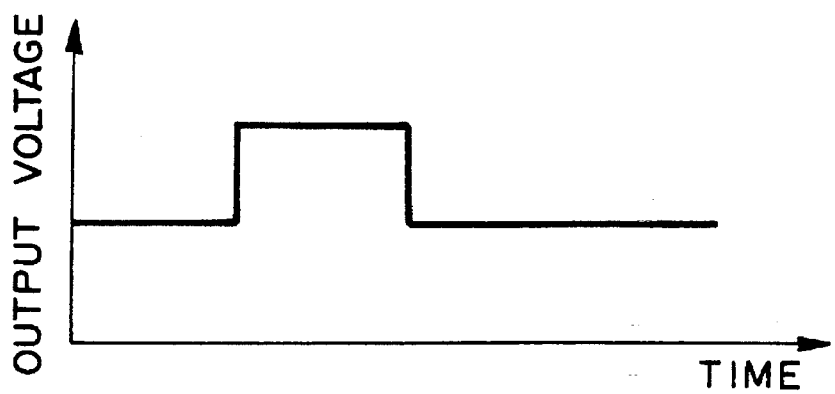
Figure 1C:
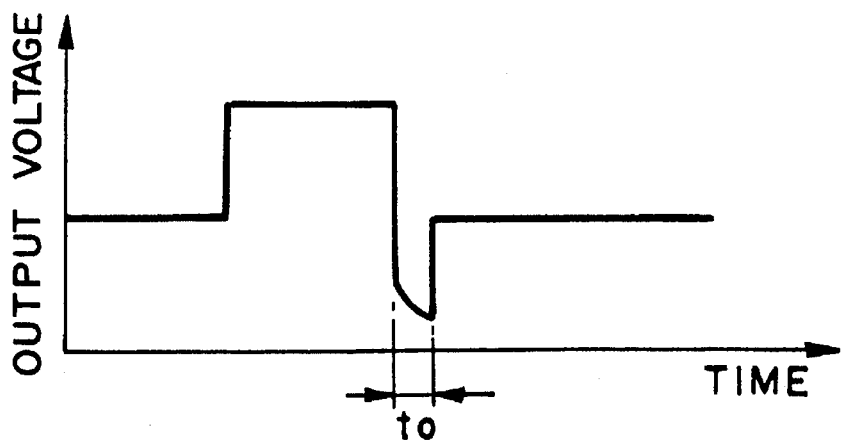

Before the output voltage of the operational amplifier 22 attains the maximum output voltage, the effective resistance of the Zener diode 51 is in an infinite state, and hence no current flows through the Zener diode 51. However, when the output voltage of the operational amplifier 22 reaches the maximum output voltage as a result of the input of a current signal Iin in excess of a normal level, the Zener diode 51 allows the current to flow (the effective resistance of the Zener diode 51 becomes smaller). In this way, when the Zener diode 51 allows the current to flow, the output voltage of the operational amplifier 22 drops, thereby preventing output voltage overshoot. Hence, an abnormal output shown in FIG. 1c, which occurs when the current signal Iin returns to the normal level, is prevented.

The diode 52 connected in series with the Zener diode 51 is not always necessary. However, the use of the diode 52 causes a load capacitance of the operational amplifier 22 to drop, resulting in stable operation of the operational amplifier.

The feedback compensation circuit consisting of the capacitor 32 and the transistor 33 is not always necessary. However, the combination of this phase compensation circuit with the logarithmic amplifier of the present invention is particularly preferable because it results in high speed of operation and large input characteristic (a wide dynamic range) at one time. In other words, the equivalent resistance of the circuit consisting of the resistor 30, the Zener diode 51, and the diode 52 is large at the time of a low input, and therefore a small equivalent capacitance is sufficient for the phase compensation circuit. As a result of this, a time constant formed by the equivalent capacitance and the feedback transistor 35 becomes smaller, and it becomes possible to respond over a larger frequency range. On the other hand, the equivalent resistance of the feedback transistor 35 is small at the time of a large input, and therefore the equivalent capacitance of the phase compensation circuit can be made larger. As a result of this, even when the equivalent resistance of the circuit consisting of the resistor 30, the Zener diode 51, and the diode 52 is small, a stable output is obtained.

Figure 3:
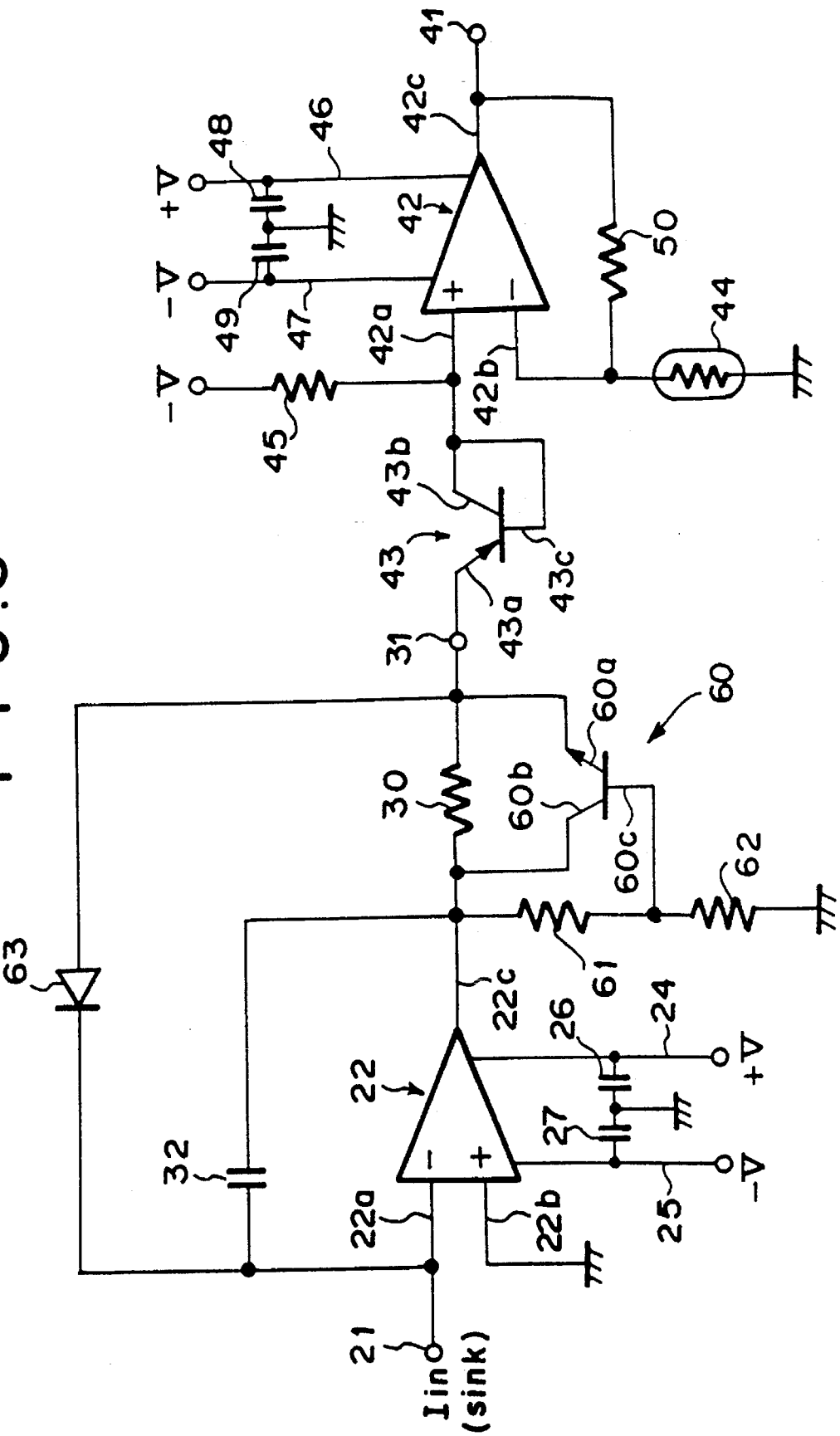
FIG. 3 is a schematic diagram showing a logarithmic amplifier according to a second embodiment of the present invention.

A logarithmic amplifier according to a second embodiment of the present invention will now be described with reference to FIG. 3. In FIG. 3, the same reference numerals are provided to designate corresponding features in FIG. 2, and hence the explanation thereof will be omitted here for brevity.

In the second embodiment, instead of the element employed in the first embodiment which consists of the Zener diode 51 connected in series with the diode 52, the logarithmic amplifier is provided with an NPN transistor 60 and resistors 61 and 62. An emitter 60a and a collector 60b of the transistor 60 are connected to either end of the resistor 30, respectively. A base 60c is grounded via the resistor 62, as well as being connected to the output terminal 22c of the operational amplifier 22 via the resistor 61. In this embodiment, the transistor 33 used in the first embodiment is omitted, and a diode 63 is provided in lieu of the feedback transistor 35.

In the above configuration, before the output voltage of the operational amplifier 22 attains the maximum output voltage, the equivalent resistance of the transistor 60 is in a so-called infinite state, and hence the transistor 60 does not allow the flow of a current. However, when the output voltage of the operational amplifier 22 reaches the maximum output voltage as a result of the input of an excessive current signal Iin, the transistor 60 starts to allow the flow of the current (the equivalent resistance of the transistor 60 becomes smaller). Hence, even in this case, the abnormal output, shown in FIG. 1C, which arises when the current signal Iin returns to the normal level is prevented in the same manner as in the first embodiment.

The input current signal Iin in the previously mentioned two embodiments is of a sink type. If the input current signal Iin is of a source type in the circuit configuration shown in FIG. 2, all that needs to be done is to connect the Zener diode 51 with the diode 52 in a reversed manner. On the other hand, if the input current signal Iin is of a source type in the circuit configuration shown in FIG. 3, all that needs to be done is to use a PNP transistor instead of the NPN transistor 60.

Several embodiments of the invention have now been described in detail. It is to be noted, however, that these descriptions of specific embodiments are merely illustrative of the principles underlying the inventive concept. It is contemplated that various modifications of the disclosed embodiments, as well as other embodiments of the invention, will, without departing from the spirit and scope of the invention, be apparent to persons skilled in the art.

What is claimed is:

1. A logarithmic amplifier including an operational amplifier for logarithmic conversion and a feedback circuit for feeding back an output of the operational amplifier via a resistor connected to an output terminal of the operational amplifier, said logarithmic amplifier further comprising:

an element having an effective resistance which becomes smaller when a voltage of more than a predetermined value is applied to the element, the element being connected in parallel with the resistor.

2. The logarithmic amplifier as defined in claim 1, wherein the element is a Zener diode.

3. The logarithmic amplifier as defined in claim 1, wherein the element comprises a Zener diode and a diode connected in series with each other.

4. The logarithmic amplifier as defined in claim 2, wherein a Zener voltage of the Zener diode is below a value obtained by subtracting a voltage drop, which is caused by elements forming the feedback circuit, from a maximum output voltage of the operational amplifier.

5. The logarithmic amplifier as defined in claim 3, wherein a Zener voltage of the Zener diode is below a value obtained by subtracting a voltage drop, which is caused by elements forming the feedback circuit, from a maximum output voltage of the operational amplifier.

6. The logarithmic amplifier as defined in claim 1, wherein the element is a transistor with a collector and an emitter thereof being respectively connected to either end of the resistor and with a base thereof being connected to the operational amplifier via other resistors.

7. The logarithmic amplifier as defined in claim 1, further comprising:

an oscillation prevention circuit including a capacitor connected in series with a control circuit for controlling the oscillation prevention circuit wherein the amount of feedback by way of the oscillation prevention circuit is reduced according to an input current to the operational amplifier, wherein the oscillation prevention circuit and the control circuit are connected in parallel with the feedback circuit and the resistor.

8. The logarithmic amplifier as defined in claim 2, further comprising:

an oscillation prevention circuit including a capacitor connected in series with a control circuit for controlling the oscillation prevention circuit wherein the amount of feedback by way of the oscillation prevention circuit is reduced according to an input current to the operational amplifier, wherein the oscillation prevention circuit and the control circuit are connected in parallel with the feedback circuit and the resistor.

9. The logarithmic amplifier as defined in claim 3, further comprising:

an oscillation prevention circuit including a capacitor connected in series with a control circuit for controlling the oscillation prevention circuit wherein the amount of feedback by way of the oscillation prevention circuit is reduced according to an input current to the operational amplifier, wherein the oscillation prevention circuit and the control circuit are connected in parallel with the feedback circuit and the resistor.

10. The logarithmic amplifier as defined in claim 4, further comprising:

an oscillation prevention circuit including a capacitor connected in series with a control circuit for controlling the oscillation prevention circuit wherein the amount of feedback by way of the oscillation prevention circuit is reduced according to an input current to the operational amplifier, wherein the oscillation prevention circuit and the control circuit are connected in parallel with the feedback circuit and the resistor.

11. The logarithmic amplifier as defined in claim 5, further comprising:

an oscillation prevention circuit including a capacitor connected in series with a control circuit for controlling the oscillation prevention circuit wherein the amount of feedback by way of the oscillation prevention circuit is reduced according to an input current to the operational amplifier, wherein the oscillation prevention circuit and the control circuit are connected in parallel with the feedback circuit and the resistor.

12. The logarithmic amplifier as defined in claim 6, further comprising:

an oscillation prevention circuit including a capacitor connected in series with a control circuit for controlling the oscillation prevention circuit wherein the amount of feedback by way of the oscillation prevention circuit is reduced according to an input current to the operational amplifier, wherein the oscillation prevention circuit and the control circuit are connected in parallel with the feedback circuit and the resistor.

* * * * *